United States Patent [19]

Michel et al.

[11] Patent Number: 5,470,394
[45] Date of Patent: Nov. 28, 1995

[54] METHOD AND APPARATUS FOR TREATING AND CLEANING PLATES BY MEANS OF A CENTRAL REACTOR

[75] Inventors: Georges L. Michel, Marseille; Olivier M. Nathan, Gardanne, both of France

[73] Assignee: Sapi Equipements S.A., France

[21] Appl. No.: 916,120

[22] PCT Filed: May 15, 1992

[86] PCT No.: PCT/FR92/00433

§ 371 Date: Jul. 29, 1992

§ 102(e) Date: Jul. 29, 1992

[87] PCT Pub. No.: WO92/21142

PCT Pub. Date: Nov. 26, 1992

[30] Foreign Application Priority Data

May 24, 1991 [FR] France .................................. 91 06558

[51] Int. Cl.⁶ ................................................. B08B 3/04
[52] U.S. Cl. ........................... 134/25.4; 134/1; 134/32; 134/42; 134/82; 134/158; 134/164; 414/226
[58] Field of Search ................... 134/25.1, 25.4, 134/26, 1, 32, 33, 34, 42, 82, 134, 158, 164, 902; 414/226, 225, DIG. 7, DIG. 4

[56] References Cited

U.S. PATENT DOCUMENTS

| | | | |
|---|---|---|---|
| 4,611,966 | 9/1986 | Johnson | 414/226 X |
| 4,682,614 | 7/1987 | Silvernail et al. | 134/902 X |
| 4,840,530 | 6/1989 | Nguyen | 414/404 |
| 4,987,407 | 1/1991 | Lee | 414/DIG. 4 X |
| 5,054,988 | 10/1991 | Shiraiwa | 414/DIG. 7 X |
| 5,069,236 | 12/1991 | Pierson | 134/902 X |
| 5,143,103 | 9/1992 | Basso et al. | 134/902 X |
| 5,221,360 | 6/1993 | Thomson et al. | 134/902 X |

FOREIGN PATENT DOCUMENTS

| | | |
|---|---|---|
| 0292090 | 11/1988 | European Pat. Off. . |
| 0188923 | 10/1984 | Japan ......................... 134/902 |
| 0304733 | 12/1989 | Japan ......................... 134/902 |
| 0404619 | 2/1992 | Japan ......................... 134/902 |
| WO81/02533 | 9/1981 | WIPO . |

OTHER PUBLICATIONS

JP-A57-31132 Seikosha et al., *Patent Abstracts of Japan*, 6, 99 (E-111)(977), Jun. 8, 1982.

*Primary Examiner*—Richard O. Dean
*Assistant Examiner*—Saeed T. Chaudhry
*Attorney, Agent, or Firm*—Bacon & Thomas

[57] ABSTRACT

The present invention relates to central reactor apparatus for applying cleaning treatments to plates such as regularly-shaped flat parts e.g. semiconductor media as used for making integrated circuits, or optical disks, etc. . . . The apparatus comprises a chamber including side walls, an end wall, an opening through a front plate facing said end wall, support means enabling a plurality of parts to be supported, means for injecting treatment fluids, closure means for closing said chamber, and discharge means for discharging said fluids, thereby enabling said parts to be treated by means of said fluids and subsequently enabling the chamber to be emptied. Said means for supporting the parts is secured to the closure means and is constituted by two side combs which are articulated on links enabling the combs to be tilted apart from each other to enable said parts to pass between them, and then to be tilted towards each other so that they engage beneath the parts and support them inside said chamber.

10 Claims, 3 Drawing Sheets

METHOD AND APPARATUS FOR TREATING AND CLEANING PLATES BY MEANS OF A CENTRAL REACTOR

DESCRIPTION

The present invention relates to methods and apparatuses for treating and cleaning plates, such as flat parts of regular shape, by means of a central reactor.

The technical field of the invention is manufacturing machines and devices for treating parts chemically.

BACKGROUND OF THE INVENTION

One of the main applications of the invention is treating plates essentially for cleaning purposes, which plates are in the form of flat disks of the semiconductor type as used for making integrated circuits. However, other applications are possible, e.g. for treating flat glass screens such as those for monitors or television sets, or optical disks, or hard disks as used in computing, or any other thin-film part providing it can be defined as being a flat part of regular shape.

The material from which the plates are made may be a ceramic, silicon, or some other material; they are slices cut very finely and then coated, etched, and/or cleaned.

These various operations must be performed with the best possible efficiency in as short a time as possible, firstly to improve the reliability of the resulting plates and secondly to reduce manufacturing costs.

In the description below, methods and devices relating to cleaning semiconductor plates are described essentially with reference to the prior art, however it is clear that, as specified by the claims, the present invention is applicable to any other regularly-shaped circular flat part such as flat screens, solar filters, optical disks, etc. and also to other chemical treatments of such parts, and not only to cleaning.

Various methods and devices are known for cleaning plates in which the plates are handled and transferred from one workstation to another in support-baskets from which they are extracted singularly or in groups for treatment in each workstation.

Cleaning operations are very difficult to perform since the particles to be removed are very small, arising (even when there is no external pollution) e.g. from an etching operation, which particles must not be left in the grooves created in this way in the plates, which grooves are themselves very fine, since a single such particle can give rise to an interfering electrical contact that prevents a portion of the plate concerned being usable and thus requires the plate to be rejected.

Cleaning is essential for this purpose, is critical, and is performed in a sealed clean room using three different types of method:

the plate-by-plate method which consists in treating the plates one-by-one in succession in cleaning chambers placed side-by-side, thereby constituting an operation that is lengthy, that requires a large amount of space, and many handling operations;

the tank-by-tank method which consists in performing the same operations as above, but displacing the plates while they are grouped together in baskets, thereby enabling the operations to be performed more quickly than in the preceding method, but still needing a large amount of space for the various cleaning tanks; and the method using a central reactor, as in the present invention, which method is currently the preferred method since it takes up less space in a clean room where space is at a premium and it enables the drying operation to be accelerated: instead of moving baskets of plates as in the preceding method through a plurality of successive cleaning tanks, possibly including different cleaning substances and taking up a great deal of space, each basket is enclosed in succession in a chamber or vat within which cleaning fluids are sprayed onto the plates or which is filled with cleaning fluid until the baskets are immersed; once the various treatment operations have been performed and the cleaning substances removed from the inside volume of the chamber, the plates are dried by centrifuging the basket.

Various types of apparatus using the above method are described in European patent application EP 0 047 308 filed under U.S. priority of Feb. 27, 1981, and EP 0 292 090 filed under U.S. priority of Feb. 29, 1988, by a company named Semitool.

In such "washing machine" type devices, as in others using the same principle of drying by centrifuging, the plates are initially transferred from their transport baskets into another basket specific to the device and serving not only to hold the plates in place during centrifuging, but also to transmit rotary motion to them.

That method therefore requires two handling operations for transferring plates from one basket to another since the basket for transporting plates from one workstation to another is also specific to that purpose, the mechanics are therefore complex to implement and there are problems of equilibrium and of inertia. In addition, because of their volume and size, the mechanical parts mask the plates to be cleaned to some extent, thereby making it impossible to guarantee that cleaning is uniform or that the quality of the operation is repeatable.

The problem to be solved is thus that of being capable of performing operations of treating and/or cleaning any regularly-shaped flat parts in a chamber of a "central reactor" device, while making use of as few intermediate mechanical parts as possible, while performing as few handling operations as possible on said flat parts to be treated and/or cleaned, and while obtaining optimum quality with respect to repeatability and uniformity in the treatment and/or cleaning.

SUMMARY OF THE INVENTION

A solution to the problem posed is a method of treating regularly-shaped flat parts using a chamber having side walls, an end wall, an opening in a front plate facing said end wall, support means enabling a plurality of parts to be carried, means for injecting treatment fluids therein, means for closing said chamber, and means for discharging said fluids, thereby enabling said parts to be treated by said fluids, and enabling said fluids subsequently to be discharged from said chamber, in which:

said flat parts stored in a transport basket are brought beneath said chamber which is opened by moving the shell constituting the chamber away from its closure means;

said parts are transferred by any suitable means from the basket into the open volume of said chamber;

said parts are grasped by tilting two lateral combs that were previously moved apart, and which engage beneath said parts so as to constitute support means for them, and said transfer means is withdrawn;

said chamber is closed by moving said shell over said parts and their supporting combs until contact is made against the closure means, and the assembly is sealed; and treatment is performed by injecting fluids into the chamber using said means for injecting treatment fluids, then at the end of treatment after the fluids have been discharged by said discharge means and after the chamber has been reopened, said parts are transferred back down into their transport basket.

Preferably, in order to ensure better uniformity of the treatments on the surface of said parts, particularly when they are circular in shape, said lateral support combs are rotated so that said flat parts rotate slowly inside said chamber about their own axes.

In addition, during treatments involving the spraying of fluids, and in order to improve the spread thereof over the surface of said parts, said fluids are sprayed using nebulizer strips having orifices which are situated in the planes between adjacent parts.

In a preferred implementation of the treatments for cleaning and drying said parts after all treatments by liquids, said chamber is filled until the parts are completely immersed in a hot liquid having high water-absorption ability, after which said fluid is discharged at a speed no greater than that at which the capillarity tensions of said liquid on the surface of said parts are in equilibrium, thereby enabling non-adhering particles for removal to be entrained.

The result is to provide novel methods and apparatuses for treating flat parts of regular shape, such as semiconductor wafers in particular, thereby enabling the parts to be treated and then cleaned under the best possible conditions.

The essential feature of the methods and apparatuses of the present invention is the elimination of the intermediate support baskets that have previously been situated inside the treatment machines, thus constituting lost volume, masking the parts or plates to be treated, impeding proper circulation of the fluids, and themselves constituting elements that are very difficult to treat.

In the present invention, there are no longer any support baskets inside the machine since the plates or parts are held solely by two lateral combs which are retracted to transfer said plates into or out from the treatment shell.

Thus, by greatly reducing the system for supporting and holding the plates inside the shell, the volume of the chamber per se can be considerably reduced: at present the volumes of such chambers are of the order of at least 30 liters, whereas in the methods and apparatuses of the present invention, the volume of the chamber may be reduced to about 15 liters.

In addition, having no significant loss volume around the parts to be treated or cleaned makes it possible to obtain better uniformity of the cleaning or the treatment, and also makes it possible to obtain greater repeatability and improved quality in the final result.

The treatment support basket used in present systems is itself a source of contamination since it is constituted by a plurality of parts that may themselves trap particles of pollution, and once in the chamber during treatment these particles can end up polluting the parts to be cleaned.

In the present invention, the system of drying by centrifuging is no longer used, thereby eliminating not only the support basket, but also various mechanical parts that encumber and complicate present systems, that increase inertia forces, and that provide problems of balancing. Nevertheless, it is possible to enhance good distribution of the treatment fluids, and thus good uniformity thereof by slowly rotating the parts themselves, in particular when they are disks.

Drying is performed by hot liquids which are discharged a slow speed, thereby entraining the particles to be removed, which is made possible by the above-mentioned reduction in the volume of the chamber, whereas in chambers of large volume, this type of drying would be very slow and much more expensive. This type of drying is nevertheless known in other methods, but has not been used so far in the intended applications of the present invention.

Similarly, and in addition, the chamber or the shell once sealed and because of its horizontal position may be filled with an inert atmosphere such a nitrogen between the various treatment steps, with said gas then serving to push out the fluid after each operation so as to accelerate discharge thereof and facilitate the above-defined drying method.

Another advantage of apparatuses and methods of the invention is that when the liquids are inserted into said chamber so as to completely immerse said parts to be treated, it is then possible to perform at least one treatment by applying sound vibration thereto, e.g. by performing ultrasound or essentially megasound treatment thereof, thus improving cleaning and etching.

This is made all the easier by the small volume of liquid contained in the chamber.

The device or machine including the apparatuses made using the present invention can thus be referred to as a multi-method machine since it enables different types of treatment to be performed in addition merely to cleaning, with central reactor machines presently often being specialized in such treatments.

Machines such as those described above make it possible to envisage treatments such as those mentioned before, but also other treatments that are not described in the present specification.

Another advantage of reducing the volume of the chamber is that the space occupied by the entire machine is also reduced, for example the machine may occupy a ground area of only about 700 mm by 700 mm, which is advantageous in a clean room since space availability is one of the problems specified above.

In addition, the multi-method ability thereof makes it possible to integrate it in a system with other treatment stations, or within a conventional unit, by adapting it to the desired method.

Similarly, it is possible to envisage juxtaposing a plurality of devices side by side or one above the other so as to perform one or more treatment methods with varying quantities of treatment fluids and/or with varying quantities of parts to be treated, together with one or more transfer and loading systems.

Finally, another advantage to be emphasized and mentioned in the context of the problem posed, is the elimination of two handling operations since the plates are no longer transferred from one basket to another before treatment and after treatment, the plates or parts to be treated being brought directly into the chamber by any appropriate transfer means suitable for placing them on the combs situated inside the chamber, and vice versa at the end of treatment.

Other advantages of the present invention could also be mentioned, but those specified above already suffice for demonstrating the novelty and the advantage of the invention.

The following description and figures show an embodiment of the invention that is not limiting in any way: other embodiments are possible within the ambit of the claims that specify the scope and the extent of the present invention, and in particular the basic shape of the various parts constituting the shell can be changed and the various possible treatments for application to the parts to be cleaned can be changed as can the shapes of the parts themselves, which parts may be of any kind.

BRIEF DESCRIPTION OF THE DRAWINGS

An embodiment of the invention is described by way of example with reference to the accompanying drawings, in which.

DETAILED DESCRIPTION

Figure 1:
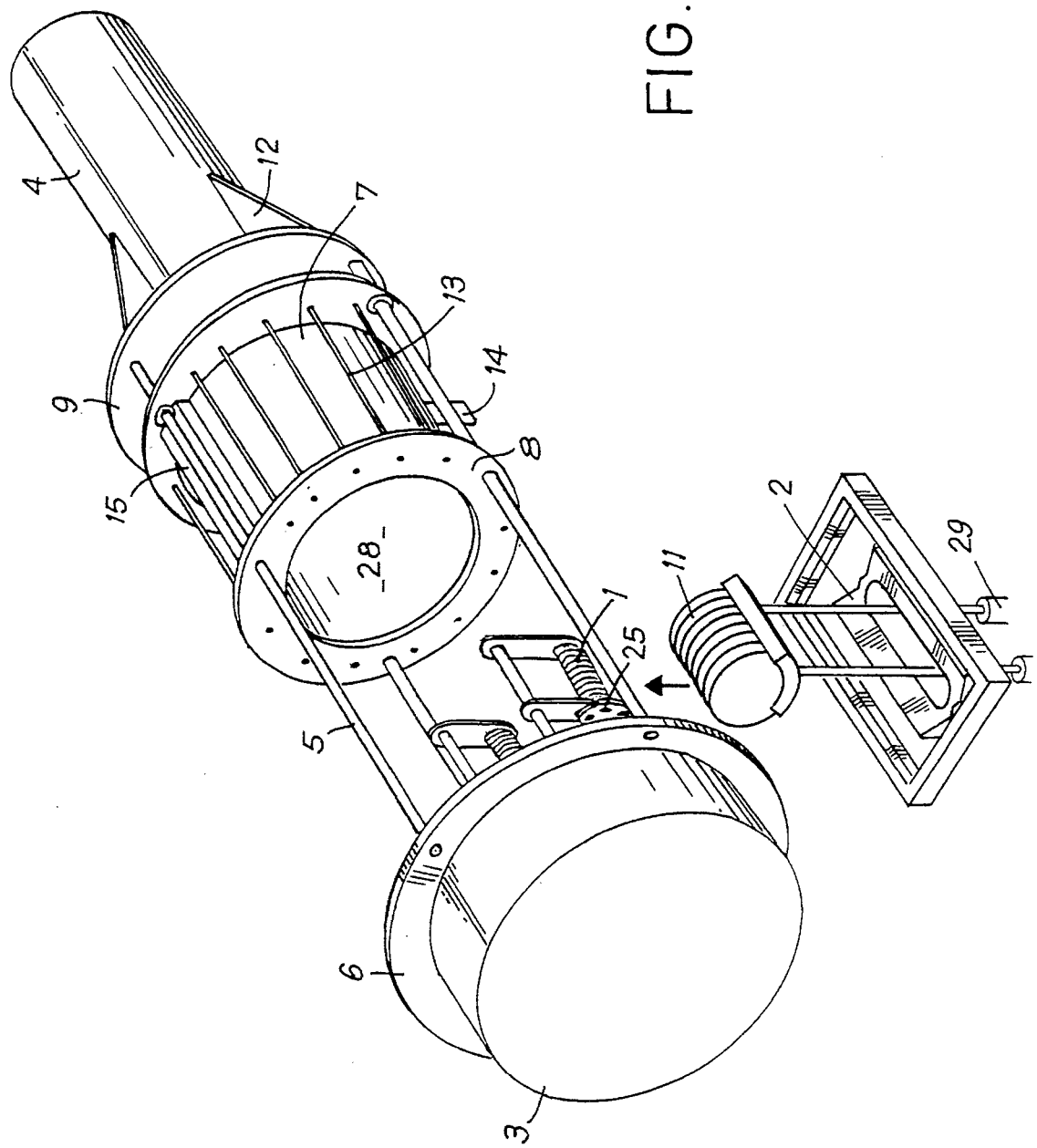
FIG. 1 is a perspective view of a treatment apparatus.

In common with other apparatuses that already exist, the apparatus of the present invention for treating regularly-shaped flat parts 11 (represented herein by way of example as being circular) makes use in conventional manner of: a chamber 28 including side walls represented herein as being in the form of a cylindrical shell 7; an end wall 9 or back plate; an opening through a front plate 8 facing said end wall 9; support means for supporting a plurality of parts 11 and situated inside said chamber 28 during the treatment; means 15 for injecting treatment fluids; means 6 for closing said chamber 28, constituted in this case by a cover 6 supporting a cap 3; and discharge means 14 for said fluid, thus making it possible to use fluid to treat said parts once inserted into the chamber, and then to remove the fluid.

Unlike present apparatuses in which said parts 11 are inserted (after being transferred into a special basket) along the axis of said chamber 28 by opening and completely disengaging the closure system of the cover 6, in the present invention said chamber 28 is opened merely by moving the shell 7 constituting the chamber 28 along its axis away from the closure means 6, thereby disengaging a working volume into which said parts 11 can be inserted from beneath. To do this, the cover 6 and its front cap 3 are taken to be fixed, and it is the shell 7 with its front and back plates 8 and 9 which is moved along guide bars 5 by means of apparatus as shown in FIG. 2. The said flat parts 11 are previously stored in conventional manner in a transport basket 2 which is brought beneath said chamber 28, and when the chamber is opened the said parts 11 are transferred by any appropriate means 29 from the basket 2 into the open volume of said chamber 28 without requiring a special treatment basket inside said chamber.

In the present invention, said support means for the parts 11 as is required for holding the parts inside the chamber does not move relative to the chamber but is secured to the closure means 6. Said support means is constituted by two lateral combs 1 which are hinged on tilting links 16 and 17 as shown in FIGS. 2A and 2B and 3 enabling them to be moved apart by tilting, thereby enabling said parts 11 to pass between the combs, and then enabling the combs to be tilted back together again so as to hold up the parts and keep them inside the said chamber 28 while they are being subjected to the desired and selected treatments.

Figure 2A:
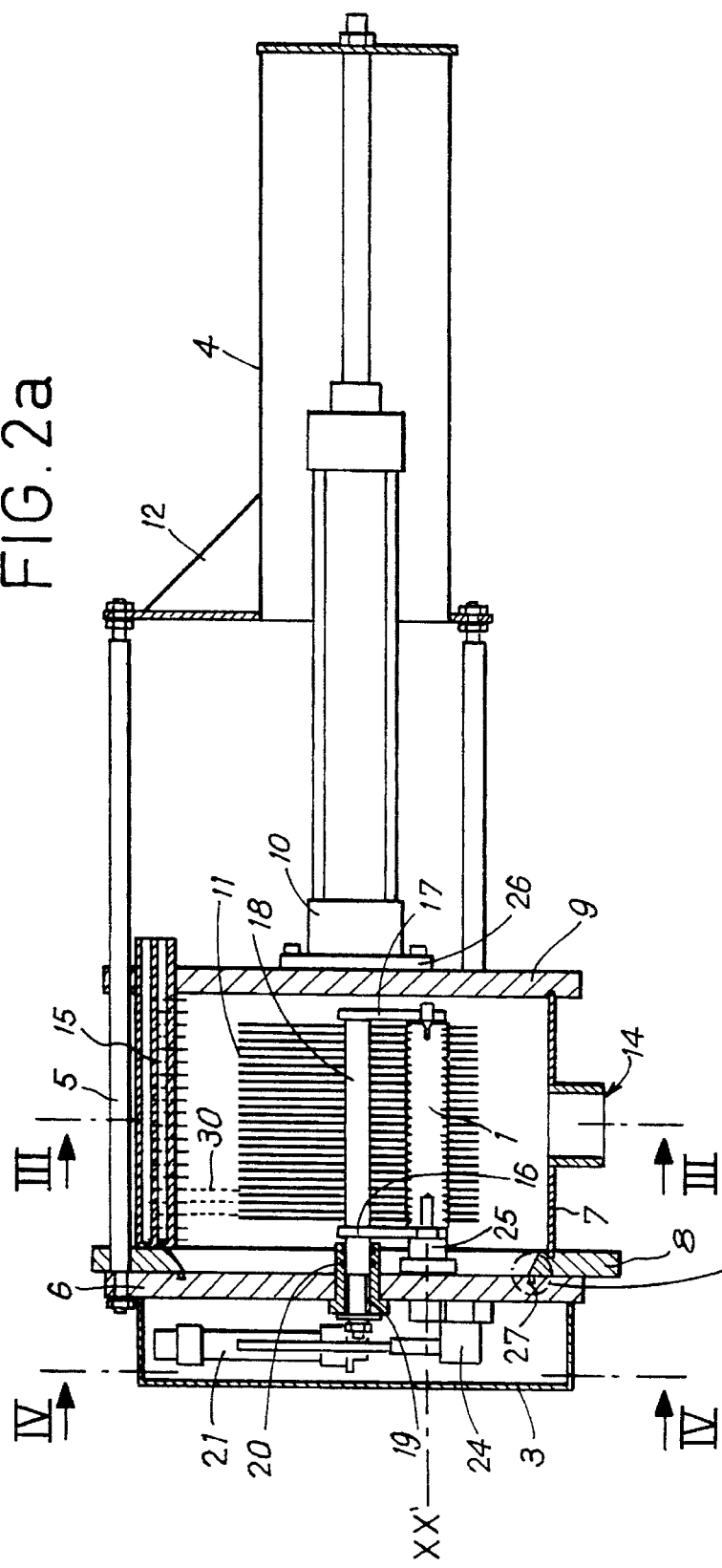
FIGS. 2A and 2B are longitudinal sections through the apparatus.
Figure 2B:
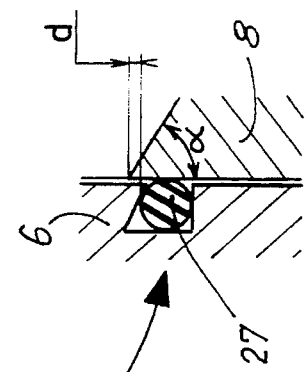
Figure 3:
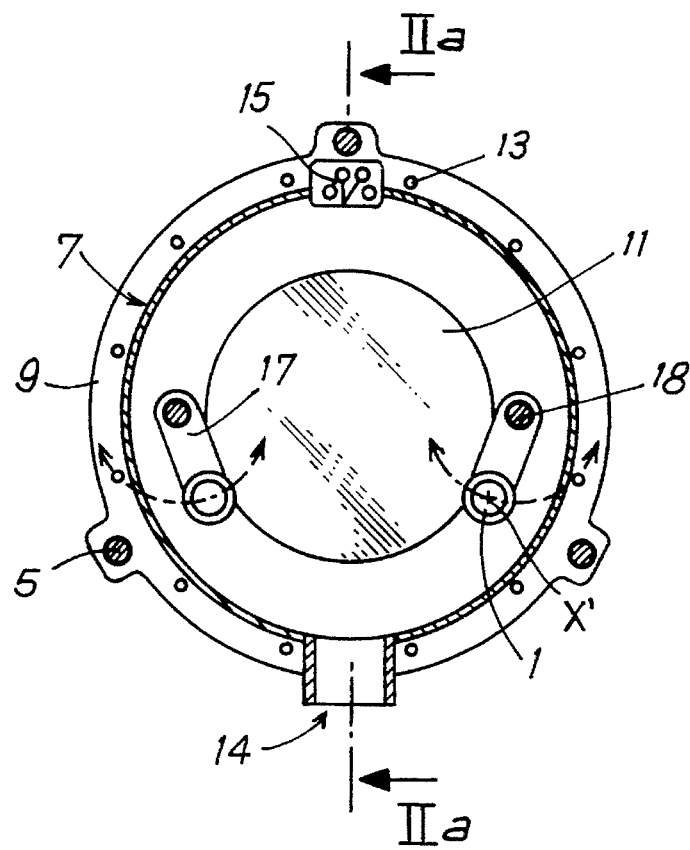
FIG. 3 is a cross-section through the chamber of the apparatus.
Figure 4:
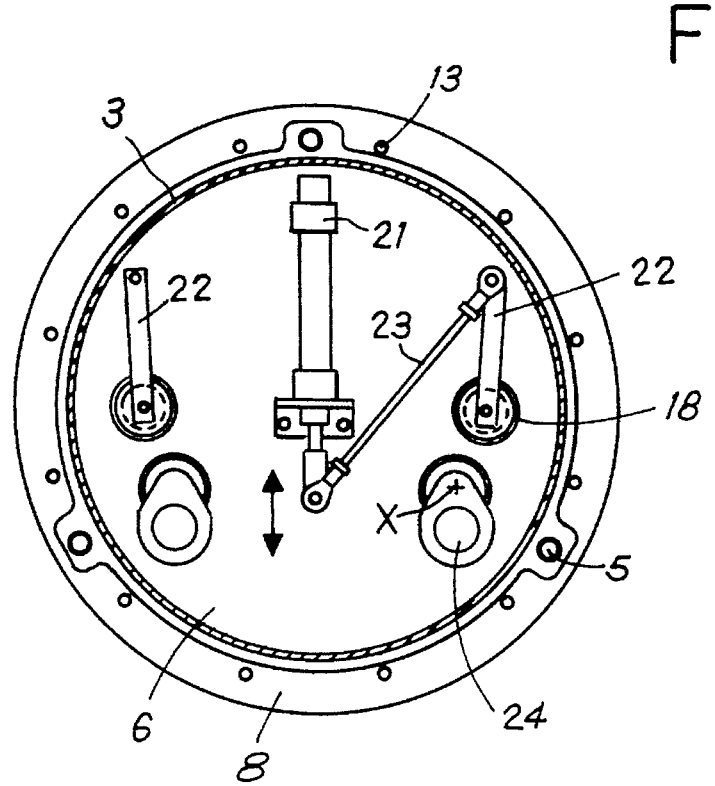
FIG. 4 is a cross-section through the front cover of the apparatus.

In a preferred embodiment, and particularly when the flat parts 11 are circular in shape, as shown in the examples of the figures (but also conceivable for non-circular shapes), said lateral combs 1 are mounted on shafts that can be rotated, e.g. by magnets secured to the shafts of the combs and driven by an external drive system as shown in FIGS. 2A, 2B and 4.

The shell 7 may be constituted as described above by a tubular side wall connected at its ends to a front plate 8 and a back plate 9, with the back plate being closed whereas the front plate is open, thereby moving over a set of parts placed on the combs 1 during displacement of the chamber.

The plates 8 and 9 are interconnected by tie bars which provide strength and support, and ensure that said shell 7 withstands pressure when said chamber 28 is put under pressure.

The system shown in FIGS. 2A and 2B for displacing the shell may be covered by a rear structure or cap 4 which is connected to the guide system 5 by a plate and by gusset plates 12 which ensure rigidity, such that the front cap 3 and its cover 6, the guide bars 5, and the rear cap 4 together constitute a mechanical assembly that is rigid and united. Other translation means not including the rear cap 4 and possibly less rigid may be used, particularly when the function of locking the closure means against the shell for sealing purposes is separated from the function of moving the shell in translation against said closure means.

FIGS. 2A and 2B are longitudinal section views through the same apparatus as that shown in FIG. 1, on a vertical plane that intersects the apparatus on the axis and support shaft of the combs so as to make the description more understandable.

Whereas FIG. 1 shows the shell 7 in its open position where the parts or plates 11 to be treated or cleaned can be inserted into the chamber 28, in FIGS. 2A and 2B the chamber 28 is shown closed by moving the shell 7 until its front plate 8 bears against the cover 6 and provides sealing. This can be done either directly by the translation system as described below providing the necessary thrust, or else by any means independent therefrom that provide a sealed locking function after said shell has been moved in translation and brought to bear against said closure means. The locking function may be provided by fingers, by a rotary clamp, or by any other known device as used whenever a sealed enclosure is to be made that can withstand some minimum pressure. This makes it possible not only to achieve better sealing and thus better safety, but also to lighten the system for moving the shell in translation.

The shell 7 may be moved in translation by means of an actuator 10, having one end secured to the back plate or end wall of the shell 7, e.g. by means of a thrust plate 26 engaging said back plate, and having its other end secured to the rear plate 4 and also to the cover 6 via the gussets 12 and the guide bars 5 in the event that it is desired for the system to provide not only translation but also sufficient thrust to obtain sealing against the closure means. In addition to its opening and closing function, the actuator 10 can then also be used to seal the chamber 28 by pressing the front plate 8 against the cover 6 and by means of a gasket 27 such as that shown in the fragmentary detail given in FIG. 2.

Thus, the closure means 6 of said chamber 28 bears in sealed manner against the front plate 8 either because of the actuator 10 or else because of any other locking means providing sealing of the shell 7 independently of the means that provides translation thereof. By compressing the gasket 27 (which can withstand a force of about 100 kg, for example), it is possible to reduce the pressure in said chamber to a vacuum or to increase the pressure therein, thereby making it possible to perform various different types of treatment as mentioned above and as described in greater detail below.

The said gasket 27 is an O-ring situated in a groove formed in the closure means 6 and having its inside edge at a distance d from the inside edge of the opening in the front plate 8, which distance is as small as possible while remaining compatible with the tolerances for the mechanical clearances of said apparatus. The opening in the front plate 8 is formed conically, flaring at an angle α towards the inside of the chamber 28. The angle a is preferably about 30°. It prevents fluids being retained and thus makes better cleaning of the chamber possible while economizing on washing and treatment fluids.

The distance d between the above-specified edges must be kept as small as possible so as to avoid trapping particles of pollution that could disturb the treatment.

The gasket 27 could alternatively be situated in other embodiments in a groove formed in the plate 8 of the shell 7.

In addition to being necessary to some small extent to prevent liquid leaking from the said chamber which is in a horizontal or a nearly horizontal position, said sealing has the advantage of making it also possible to fill the chamber with an inert gas such as nitrogen between various treatment steps, and even to put the gas under pressure. Such pressure can help expelling liquid via the discharge 14 by pushing against the liquid, and it also facilitates drying the plates to be cleaned. It also serves to ventilate the chamber between two passes of treatment fluid.

Said treatment fluids are conveyed by a strip 15 which may be an atomizing or nebulizing strip for the purpose of spraying said fluid onto said parts to be treated.

This principle and this fluid spray apparatus are known in other treatment machines, but in the present invention it is preferable to dispose the jets from the strip 15 so that they lie on the axes of the inter-part gaps such that the orifices in the strip lie in planes between pairs of adjacent parts or plates 11. This is made possible because of the way said combs 1 are fixed so that they hold said parts to be cleaned in accurate positions that are known relative to the cover 6 and thus to the shell and the chamber 28 as a whole. In an embodiment where the inter-part gaps are at a pitch of about one-tenth of an inch, the jets 30 may be directed exactly into said gaps, thereby obtaining greater uniformity in the spraying and atomizing of the treatment fluids, which is not possible in present systems in which the support basket does not allow such accuracy since it is movable inside the chamber.

Furthermore, in addition to said jets 30 directed into the gaps between said parts, said strip or other strips 15 may spray jets against the inside wall of the shell so as to ensure that it is washed, thereby keeping the inside of said chamber 28 as unpolluted as possible.

In FIG. 2, the small size of said chamber compared with the size of the parts or plates 11 to be treated can be seen, and this due to the specific dispositions of the present invention, and in particular to the way in which the support combs 1 are disposed, being suspended from pivot shafts by front and back links 16 and 17, which also serve to tilt the combs 1 firstly to open the bottom space through which said parts are inserted into the chamber and secondly to tilt them into said space where they can support said parts, as described above and as shown in FIG. 3 which is a section on BB.

These comb-supporting shafts 18 can be rotated through the cover 6 by means of a bearing 19 or through-passage that provides sealing by means of an O-ring 20 about the shafts 18 so as to seal against the reduced or increased pressure that may exist inside the chamber.

The shaft 18 can then be rotated through the appropriate angle by means of a linkage as shown in FIG. 4 which is a section on AA, the linkage being driven by a linear actuator 21. It is quite simple to provide sealing along the shaft 18 since the rotation thereof is no more than one-fourth of a turn so it does not require high sealing accuracy as may be required by a shaft that rotates continuously and at high speed, e.g. as in present centrifugal machines, where the seals used are very expensive and constitute a source of contamination.

As for the possibility of slowly rotating the combs 1 themselves essentially for the purpose of treating circular flat parts 11, this may be achieved by means of magnets secured to the ends of the comb shafts 25 and not passing through the cover 6. Each of the combs 1 may be driven by means of motor and gear box unit 24 outside said chamber and secured to a magnetic coupling placed against said closure means 6 and providing drive through said closure means to a plate supporting the magnets 25 which are fixed at the end of and on the axis of said comb 1 when the comb is in its tilted position enabling said parts 11 to be supported thereby, as shown in FIG. 4.

Such magnetic drive is possible since the rotation is slow and little force is required, providing the parts are circular, such rotation being useful and advantageous merely for ensuring that the treatment of the parts inside said chamber 28 is uniform, and it therefore does not require high speed. There is thus no need for the drive system to pass through the partition and this makes it possible to simplify the mechanical implementation and the sealing of the chamber 28.

These various drive systems, such as the motor and gear box unit 24 and the actuator 21 may then be enclosed under a front protective cap 3 which has no direct function in the context of the present invention.

FIG. 3 is a section on BB of FIG. 2 showing the inside of the chamber 28 level with the support combs 1 in position to support the parts to be treated 11 after rotation about their support shafts 18.

This figure shows the various other elements of the shell 7, namely the tie bars 13 which connect the front plate 8 to the back plate 9, and the guide bars 5 which connect the cover 6 with the above-described shell drive system.

This figure also shows the atomizing strip 15 and the discharge outlet 14 which may be connected to any sealed system for recovering the fluids once treatment has been performed.

FIG. 3 shows the tilting or swinging movement of the combs 1 as dashed lines marking the circular arcs followed by their axes x', which arcs are of radius equal to the length of the links 17 and occupy angles that may be at most in the outwards direction sufficient to hold said combs 1 vertically beneath the shafts 18, and in the inwards direction where they support the undersides of the parts 11, this angle is a function of the diameters of the parts so that they can be centered as well as possible inside said chamber.

FIG. 4 is a section on line AA of FIG. 2 through the cap 3 situated on the cover 6. This figure shows the various elements of the shell that are situated behind the cover 6, namely the tie bars 13 of said shell together with its front plate 8. There can also be seen the ends of the guide rods 5 which hold the said cover 6 in position relative to the rear portion of the apparatus as described above.

The face of said cover that is then visible shows the only passages through the wall of the treatment chamber, namely the ends of the comb-supporting shafts 18. These ends are secured to cranks 22 which are connected by connecting rods 23 to the end of the actuator 21 which may be situated, for example, on the axis of said cover, and also being suitable for driving the two cranks 22 of the two comb-support shafts 18 so that they rotate and rock in the manner described with reference to above FIG. 3.

Other drive systems for said shafts 18 could also be considered.

This section AA also shows the motor and gear box units 24 for magnetically driving the magnets 25 secured to the axes of the combs 1 when they lie on the drive axes X of said motor units. In this system, the positions X and X' of the axes coincide and correspond to a single diameter for said parts 11. However, depending on the various diameters of parts 11 to be treated, the motor units 24 may need to be displaced into different positions, still without any need to drill through said cover since the drive takes place through the wall thereof.

As follows from the various treatment methods described above that can be performed in devices or machines of the present invention (which may be called open-chamber multimethod machines), it is not possible to perform centrifuging therein for drying purposes as is done in prior machines. Because of the small size of the chamber and because there is no support basket, the drying method is nevertheless such that after any treatment of said parts 11 by means of liquids, it is possible to fill said chamber 28 until said parts 11 are completely immersed in a hot liquid (which is preferably deionized water at about 65° C. or alcohol capable of absorbing water and at a temperature of about 80° C.), with said liquid then being discharged at a speed that is no greater than the speed at which equilibrium occurs in the capillarity tensions of said liquid at the surface of said parts, as already mentioned above, thereby entraining non-adhering particles to be cleaned. This maybe improved by thrusting against said liquids by means of an inert gas such as nitrogen, thereby accelerating the operation and thus reducing treatment time.

The drying operation may be finished off by evacuating the inside of said chamber, e.g. by connecting said discharge outlet 14 to a vacuum pump.

In addition, before such evacuation, the entire chamber can be swept by means of an inert gas such as nitrogen in order to remove the last particles of pollution and/or liquid that may remain attached to said parts or to the wall of said chamber.

By combining the various operations described above, it is possible to obtain optimum drying.

We claim:

1. A method of treating regularly-shaped flat parts having no central opening, using a chamber having side walls, an end wall, an opening in a front plate facing said end wall, support means enabling a plurality of parts to be carried, means for injecting treatment fluids therein in order to completely immerse said Darts in said fluids, means for closing said chamber, and means for discharging said fluids, thereby enabling said parts to be treated by said fluids, and enabling said fluids subsequently to be discharged from said chamber, wherein:

said flat parts stored in a transport basket are brought beneath said chamber which is opened by moving the shell constituting the chamber away from its closure means;

said parts are transferred by any suitable means from the basket into the open volume of said chamber;

said parts are grasped by tilting two lateral combs that were previously moved apart, and which engage beneath said parts so as to constitute support means for them, and said transfer means is withdrawn;

said chamber is closed by moving said shell over said parts and their supporting combs until contact is made against the closure means, and the assembly is sealed; and treatment is performed by injecting fluids into the chamber using said means for injecting treatment fluids so as to immerse said parts completely in said fluids, then at the end of the treatment, after the fluids have been discharged by said discharge means and after the chamber has been reopened, said parts are transferred back down into their transport basket.

2. A method of treating regularly-shaped flat parts according to claim 1, wherein the shell is sealed against said closure means by any means independent thereof suitable for closing said chamber by moving said shell in translation against said closure means.

3. A method according to claim 1, for use with circularly-shaped flat parts, the method being wherein during said treatment by means of fluids, said lateral support combs are rotated in such a manner that said flat parts rotate about their own axes at a slow speed inside said chamber.

4. A method according to claim 1, wherein said fluids are sprayed by means of nebulizer strips whose orifices are situated in the planes between pairs of adjacent parts.

5. A method according to claim 1, wherein at least one sound-vibration treatment is performed on said parts after said injection of said liquid fluids into the chamber.

6. A method according to claim 1, wherein after any treatment of said parts by means of liquids, said chamber is filled with a hot liquid having high capacity for absorbing water, filling continuing until the parts are fully immersed, after which said liquid is discharged at a speed no greater than the speed providing equilibrium for the capillarity tensions of said liquid on the surface of said parts and enabling non-adhering particles for removal to be entrained.

7. Apparatus for treating regularly-shaped flat parts having no central opening, the apparatus comprising a chamber having side walls, an end wall, an opening through a front plate facing said end wall, support means enabling a plurality of parts to be carried, means for injecting treatment fluids so as to immerse said parts completely in said fluids, closure means for closing said chamber, and means for discharging said fluids in such a manner as to enable said parts to be treated by said fluids and then to empty said chamber, wherein said support means for the parts is secured to the closure means and is constituted by two lateral combs which are articulated on links enabling them to be moved apart so as to allow said parts to pass between the combs by tilting the combs away from each other, and then enabling the combs to tilt back towards each other so as to support the parts from below and hold them in said chamber.

8. Apparatus for treating flat parts according to claim 7, the apparatus being wherein said lateral combs are rotated.

9. Apparatus according to claim 8, wherein the means for rotating each of said combs is constituted by a motor and gear box unit outside said chamber and secured to a magnetic coupling placed against said closure means and driving, through said closure means, a plate supporting magnets, said plate being fixed to the end of and on the axis of a corresponding one of said combs when said comb is tilted into its position for supporting said parts.

10. Apparatus according to claim 7, wherein the closure means for closing said chamber bears in sealed manner against the front plate by compressing a sealing ring, thereby enabling reduced pressure or increased pressure to be established inside said chamber.

* * * * *